(12) United States Patent
Jovanovic

(10) Patent No.: US 10,691,172 B2
(45) Date of Patent: Jun. 23, 2020

(54) DISPLAY WITH SHAPE CHANGING SUPPORT PANEL

(71) Applicant: Hewlett-Packard Development Company, L.P., Houston, TX (US)

(72) Inventor: Milorad L. Jovanovic, Belgrade (RS)

(73) Assignee: Hewlett-Packard Development Company, L.P., Spring, TX (US)

( * ) Notice: Subject to any disclaimer, the term of this patent is extended or adjusted under 35 U.S.C. 154(b) by 90 days.

(21) Appl. No.: 15/500,281

(22) PCT Filed: Jul. 30, 2014

(86) PCT No.: PCT/US2014/048874
§ 371 (c)(1),
(2) Date: Jan. 30, 2017

(87) PCT Pub. No.: WO2016/018300
PCT Pub. Date: Feb. 4, 2016

(65) Prior Publication Data
US 2017/0212556 A1    Jul. 27, 2017

(51) Int. Cl.
*G06F 1/16* (2006.01)
*H01L 51/00* (2006.01)
*G09F 9/00* (2006.01)
*H01L 51/52* (2006.01)

(52) U.S. Cl.
CPC .......... *G06F 1/1652* (2013.01); *G06F 1/1656* (2013.01); *G09F 9/00* (2013.01); *H01L 51/0097* (2013.01); *H01L 51/5237* (2013.01); *H01L 2251/5338* (2013.01); *Y02E 10/549* (2013.01)

(58) Field of Classification Search
CPC .... G06F 1/1652; G06F 1/1656; G06F 1/1624; G06F 1/1643; G06F 1/1647; H01L 51/5237; H01L 2251/5338; G09F 9/00; G09F 9/301; G09F 9/35
See application file for complete search history.

(56) References Cited

U.S. PATENT DOCUMENTS

| | | | |
|---|---|---|---|
| 7,310,050 B2 * | 12/2007 | Yeh | G06F 1/1624 340/815.4 |
| 7,557,875 B2 | 7/2009 | Majumdar et al. | |
| 8,096,068 B2 * | 1/2012 | Van Rens | G09F 9/35 40/514 |
| 8,194,399 B2 | 6/2012 | Ashcraft et al. | |

(Continued)

FOREIGN PATENT DOCUMENTS

| CN | 201185067 | 1/2009 |
|---|---|---|
| CN | 101681183 | 3/2010 |

(Continued)

*Primary Examiner* — Abhishek M Rathod
(74) *Attorney, Agent, or Firm* — Rathe Lindenbaum LLP

(57) ABSTRACT

An example electronic display device comprises a flexible display panel, a support panel supporting the flexible display panel, a guide about which the support panel turns and an actuator to apply a local stimulus to selected portions of the support panel that are in proximity with the guide to facilitate changing the selected portions of the support panel from a rigid planar shape to a bent shape about the guide as the support panel and the display panel are moved about the guide and such that the support panel returns to the rigid planar shape once moved away from the guide.

18 Claims, 6 Drawing Sheets

(56) References Cited

U.S. PATENT DOCUMENTS

| | | |
|---|---|---|
| 8,253,654 B2 | 8/2012 | Alberth |
| 9,287,529 B2* | 3/2016 | Chung ................ H01L 51/0024 |
| 2002/0070910 A1* | 6/2002 | Fujieda ................ G06F 1/1615 |
| | | 345/85 |
| 2006/0132429 A1* | 6/2006 | Ricks ........................ G09F 9/30 |
| | | 345/108 |
| 2007/0199176 A1* | 8/2007 | Mc Clellan ............... E05D 1/02 |
| | | 16/224 |
| 2008/0303782 A1 | 12/2008 | Grant et al. |
| 2009/0231307 A1* | 9/2009 | Lee ........................ G06F 1/1601 |
| | | 345/184 |
| 2010/0134873 A1* | 6/2010 | van Lieshout .... G02F 1/133305 |
| | | 359/296 |
| 2010/0220060 A1* | 9/2010 | Kobayashi ................ G09F 9/33 |
| | | 345/168 |
| 2010/0295820 A1* | 11/2010 | Kikin-Gil ............. G06F 3/0421 |
| | | 345/175 |
| 2011/0176260 A1 | 7/2011 | Walters et al. |
| 2012/0019482 A1* | 1/2012 | Wang .................... G06F 1/1652 |
| | | 345/175 |
| 2012/0307423 A1* | 12/2012 | Bohn .................... G06F 1/1641 |
| | | 361/679.01 |
| 2012/0320312 A1 | 12/2012 | Yang et al. |
| 2013/0058063 A1* | 3/2013 | O'Brien ................ G06F 1/1624 |
| | | 361/807 |
| 2013/0203469 A1* | 8/2013 | Cho .................... G06F 3/04886 |
| | | 455/566 |
| 2014/0002430 A1* | 1/2014 | Kwack ................. G09G 3/3225 |
| | | 345/207 |
| 2014/0015402 A1 | 1/2014 | Ahn et al. |
| 2014/0194165 A1* | 7/2014 | Hwang ................. G06F 1/1677 |
| | | 455/566 |
| 2015/0021570 A1* | 1/2015 | Kim .................... H01L 51/0097 |
| | | 257/40 |
| 2015/0090960 A1* | 4/2015 | Ma ........................ H01L 51/003 |
| | | 257/40 |
| 2015/0188096 A1* | 7/2015 | Zeng ....................... H01L 51/56 |
| | | 438/34 |
| 2015/0316962 A1* | 11/2015 | Howes .................. G03B 21/58 |
| | | 16/87.2 |
| 2016/0112667 A1* | 4/2016 | Park ...................... G06F 1/1601 |
| | | 348/739 |

FOREIGN PATENT DOCUMENTS

| | | |
|---|---|---|
| CN | 102026821 | 4/2011 |
| KR | 10-20100028343 A | 3/2010 |
| KR | 10-20120000293 A | 1/2012 |
| KR | 10-20120079493 A | 7/2012 |
| WO | WO-2014080176 | 5/2014 |

\* cited by examiner

DISPLAY WITH SHAPE CHANGING SUPPORT PANEL

CROSS-REFERENCE TO RELATED APPLICATION

This application is a U.S. National Stage Application of and claims priority to International Patent Application No. PCT/US2014/048874, filed on Jul. 30, 2014, and entitled "DISPLAY WITH SHAPE CHANGING SUPPORT PANEL," which is hereby incorporated by reference in its entirety.

BACKGROUND

Mobile or portable electronic devices are prevalent in today's society. Many people possess multiple different mobile devices for different purposes. For example, person may own a smart phone, a tablet computer and a notebook computer. Each of the mobile devices may have a unique display area suited for its chosen purpose. Owning, maintaining and caring around each of the different mobile devices is often inconvenient and sometimes impractical.

DETAILED DESCRIPTION OF EXAMPLES

Figure 1:
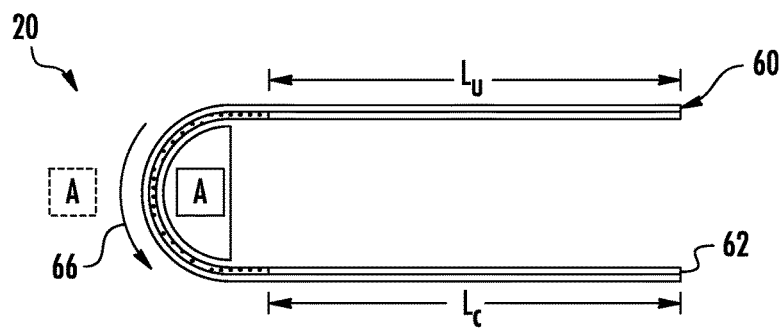
FIG. 1 is a schematic diagram of an example electronic display device in an example compact state.
Figure 2:
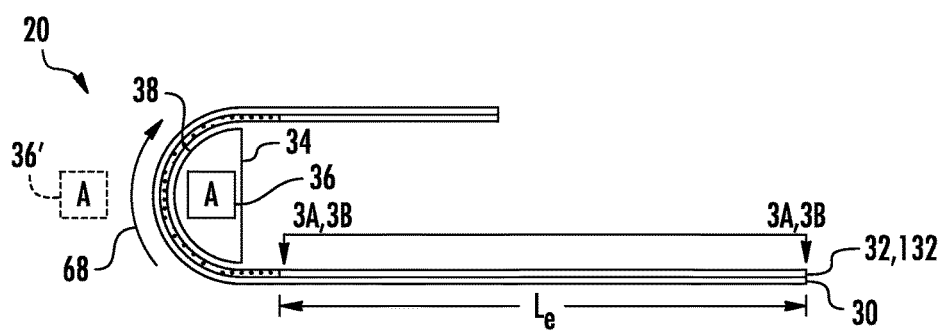
FIG. 2 is a schematic diagram of the electronic display device of FIG. 1 in an example extended state.

FIGS. 1 and 2 schematically illustrate an example electronic display device 20. FIG. 1 illustrates electronic display device 20 in first state providing a display area of a first display area while FIG. 2 illustrates the electronic display device in a second state providing a display area of a second bigger display area. As will be described hereafter, electronic display device 20 utilizes a flexible display with a shape changing support panel to provide a single electronic device with multiple user selectable display areas such that electronic display device 20 may provide a display area most suited for the current use of the electronic display device.

As shown by FIG. 1, electronic display device 20 comprises flexible display panel 30, support panel 32, guide 34 and actuator 36. Flexible display panel 30 comprises a flexible display screen to be rolled, bent or curled without damage. In one implementation, flexible display panel comprises electronic paper, such as a Gyricon brand sheet. In another implementation, flexible display panel comprises a flexible screen formed from organic light emitting diodes (OLEDs) or organic/polymer thin film transistors (TFT). In other implementations, flexible display panel comprises a screen based upon other presently developed or future developed flexible display technologies.

Flexible display panel 30 is bonded, adhered, fastened or otherwise secured to support panel 32 so as to be carried by in move with support panel 32. In one implementation, flexible display panel 30 is coextensive with support panel 32. In yet another implementation, flexible display panel 32 as an area less than an area of support panel 32. In one implementation, portions of flexible display panel 30 are not secured to support panel 32 but are suspended across voids or openings in support panel 32.

Figures 3A, 3B:
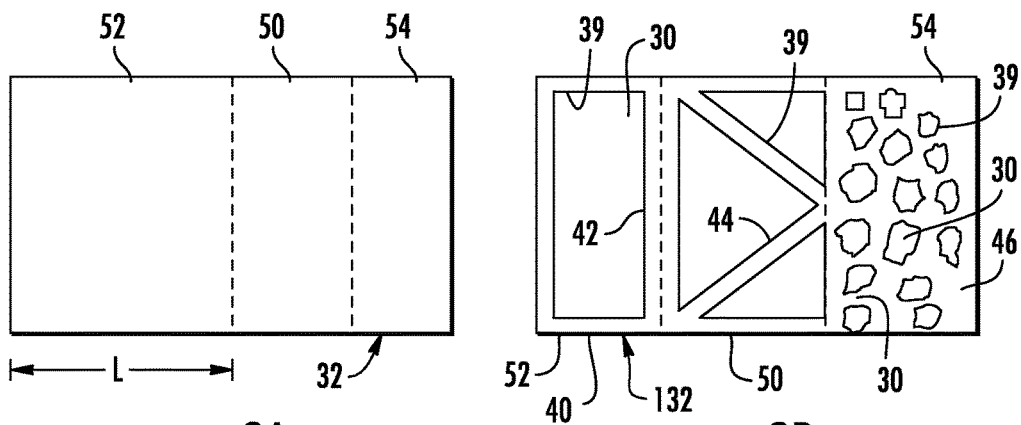
FIG. 3A is a plan view of an example support panel of the electronic display device of FIG. 2 taken along lines 3A-3A.
FIG. 3B is a plan view of an alternative support panel of the electronic display device of FIG. 2 taken along lines 3B-3B.

Support panel 32 comprises a substrate, base or backing carrying and supporting flexible display panel 30. In one implementation, support panel 32 is part of flexible display panel 30. As shown by FIG. 3A, in one implementation, support panel 32 continuously extends behind flexible display panel 30, underlying a majority, if not all of an underlying area of flexible display panel 30. In such an embodiment, support panel 32 provides enhanced support and thermal dissipation across the entire area of flexible display panel 30.

As shown by FIG. 3B which illustrates support panel 132, an alternative implementation of support panel 32, support panel 132 comprises one or more openings or apertures 39 underlying flexible display panel 30. Opening 39 are provided in support panel 132 such that portions of flexible display panel 30 span across such openings 46. Such openings 39 facilitate ventilation of flexible display panel 30 while reducing the amount of material for panel 132 and the weight of electronic display device 20.

In the example shown in FIG. 3B, support panel 132 is illustrated as having multiple different regions to illustrate different example opening architectures for openings 39. The leftward most region of support panel 32 forms a supporting framework behind flexible display panel 30. In the example illustrated in FIG. 3B, support panel 132 forms a continuous perimeter frame 40 about at least a portion of the perimeter of flexible display panel 30 and includes multiple spaced crossbeams 42, 44. Crossbeam 42 extends perpendicular to perimeter frame 44 while crossbeams 44 obliquely extend across opposite sides of the perimeter of frame 40. The rightward most region of support panel 132 is honeycombed to provide openings 39. The different opening architectures for openings 39 provide such different regions with different levels or degrees of flexibility and different levels or degrees of stiffness when such portions of support panel 132 are in a flexible state or are in a rigid state. Although support panel 132 is illustrated as including multiple regions having multiple different opening architectures for openings 39, in other implementations, support panel 32 comprises a single opening architecture for openings 39 that uniformly extends across the entire area of support panel 132.

Support panel 32, 132 is formed from one or more materials that, in response to and while receiving a locally applied stimulus, change from a rigid, stiff or self-supporting planar state to a guide conforming state which facilitates bending of support panels 32, 132 about guide 34. Once the materials of support panel 32, 132 are no longer receiving a sufficient amount of stimulus, the materials of support panel 32, 132 return support panel 32, 132 to the prior rigid self-supporting planar state. In one implementation, in the guide conforming state, support panel 32, 132 is flexible, bendable, or curlable, allowing support panel 32, 132 to assume the bent or curved shape of the adjacent guide 34. For example, in one implementation, support panel 32, 132 comprises a thermal softening polymer in response to being heated above its glass transition temperature, changes from a rigid state to a flexible or bendable state. Once the stimulus, in the form of heat, is no longer applied or support panel 32, 132 is sufficiently withdrawn from the heat so as to cool to a temperature below the glass transition temperature, support panel 32, 132 returns to the rigid state. For purposes of this disclosure, the term "rigid" means a state wherein a structure, such as panel 32, maintains its current shape and does not bend or deflect by greater than 10 degrees without cracking, fracturing or breaking. For purposes of this disclosure, the term "flexible" means a state wherein a structure, such as panel 32, 132, is elastic or bendable by at least 90 degrees without cracking, fracturing or breaking.

In another implementation, in the guide conforming state, support panel 32, 132 has shape memory materials such that, in response to and while receiving the applied stimulus, assumes a remembered shape that closely corresponds to the shape of guide 34. Once the stimulus is no longer being received, support panel 32, 132 automatically returns to a rigid planar shape. For example, in one implementation, support panel 32, 132 comprises an electro-active polymer which, in response to receiving and while receiving an applied stimulus in the form of an electric field, automatically changes from a planar shape to a bent, curved or rounded shape that corresponds to the bent, curved or rounded shape of guide 34. Once the stimulus, in the form of an electric field, is no longer applied or such portions of support panel 32, 132 are withdrawn from the electric field, support panel 32, 132 returns to the default rigid planar state. In yet another implementation, support panel 32, 132 comprises a shape memory alloy or shape memory polymer which, in response to receiving and while receiving an applied stimulus in the form of heat for panel 32, 132 above a predefined temperature, automatically changes from a planar shape to a remembered bent, curved or rounded shape that corresponds to the bent, curved or round shape of guide 34. Once the stimulus, in the form of heat, is no longer applied or such portions of support panel 32, 132 are withdrawn from the heat so as to cool below a predefined temperature, support panel 32, 132 returns to the default rigid planar state. In yet other implementations, support panel 32, 132 comprises a light-induced shape memory polymer which, in response to receiving and while receiving an applied stimulus in the form of light of a certain range of frequencies, automatically changes from a planar shape to a remembered bent, curved or rounded shape that corresponds to the bent, curved or round shape of guide 34. In yet other implementations, support panel 32, 132 comprises a electro-active shape memory polymer which, in response to receiving and while receiving an applied stimulus in the form of electric voltage, automatically changes from a planar shape to a remembered bent, curved or rounded shape that corresponds to the bent, curved or round shape of guide 34.

In one implementation, support panel 32, 132 is rigid and/or planar by default in the absence of an intentionally applied non-natural stimulus, wherein stimulus is applied to actuate panel 32, 132 to a flexible state or bent shape or to maintain panel 32, 132 in a flexible state or bent shape. A non-natural stimulus is a stimulus that support panel 32, 132 does not experience in the normal intended use of electronic display device 20 by a person. In one implementation, support panel 32, 132 is formed from one or more materials such that panel 32, 132 does not change from a rigid planar state to a flexible state or a remembered bent shape unless the encountered stimulus satisfies a predefined threshold, wherein the predefined threshold is set so as to not be inadvertently satisfied during regular use of device 20.

In one implementation, such a stimulus is temperature based, wherein a non-natural stimulus is a temperatures above 150° F. In such an implementation, support panel 32, 132 changes from a rigid state to a flexible state or from a planar shape to a bent shape in response to experiencing temperatures above 130° F. In another implementation, such as stimulus is electrical charge or electric field based, wherein support panel 32, 132 automatically changes between a rigid planar state to a flexible state or a bent shape in response to experiencing an electrical charge above a predefined threshold, the predefined threshold being set such that the state change does not inadvertently occur during use of device 20.

In one implementation, an entire length of support panel 32, 132 is formed from a material that changes from a rigid planar state to a flexible state or bent shape based upon the application of stimulus. In yet another implementation, as shown by broken lines in FIGS. 3A and 3B, an intermediate dynamic state portion 50 of support panel 32, between the static state end portions 52, 54 of support panel 32, is formed from one or more materials that change from a rigid planar state to a flexible state or bent shape based upon application of stimulus, wherein the other static state end portions 52, 54 do not change from a rigid planar state to a flexible state or bent shape in response to the same applied stimulus. For example, in some implementations, certain end portions of support panel 32, 132 are not moved across guide 34 and are not turned or bent. In some implementations, such end portions 52, 54 have a different material composition, thickness and/or arrangement of apertures (such as shown in FIG. 3B) as compared to those remaining portions of panel 32, 132 that are bent about guide 34, wherein such end portions 52, 54 of panel 32, 132 are formed from a material or materials that do not undergo a rigid-to-flexible state change or a planar to bent shape change so as to remain rigid and planar at all times during regular use of device 20. In some implementations, such static state end portions 52, 54 are provided with a greater thickness or a pattern of openings so for even increased rigidity or stiffness as compared to intermediate dynamic state change portion 50. For example, in one implementation, the honeycombed opening architecture of static state end portion 54 of support panel 132 provides greater stiffness or rigidity as compared to either intermediate dynamic state portion 50 (when in a rigid state) and static state end portion 52 of support panel 132.

In one implementation, static state end portion 52 shown in FIG. 3A has a length L equal to or less than a width of electronic device 20, wherein at least static state portion 52 and the overlying portion of flexible display panel 32 is always in use by electronic display device 20 and wherein the remaining portions of support panel 32 and the overlying flexible display panel 30 (shown in FIG. 1) are selectable for use depending upon the display area being used or requested. Such partitioning of support panel 32 into static state portions and dynamic state portions is equally applicable to the open architecture of support panel 132 shown in FIG. 3B.

Guide 34 comprises one or more structures which guide or direct movement of support panel 32 and bending or turning of support panel 32 while support panel 32 is in a flexible state. In the example illustrated, guide 34 comprises at least one arcuate or rounded surface along which support panel 32 moves. Although shown as a semi-circumferential surface, in other implementations, guide 34 may have other shapes and configurations. For example, in another implementation, guide 34 comprises a rotationally fixed cylinder or a rotatable roller. In another implementation, guide 34 comprises multiple spaced fixed cylinders or rotatable rollers. In yet another implementation, guide 34 comprises a plurality of spaced arcuate surfaces, wherein such arc which serves are spaced by a linear surface, a concavity or any other shape which is not interfere with the turning or bending of support panel 32 while support panel 32 is in a flexible state. In yet another implementation, guide 34 comprises a channel or track which guides support panel 32 in an arc or through one or more bends or turns while support panel 32 is in a flexible state or in a remembered bent shape.

In the example illustrated, guide 34 directs support panel 32 through a turn of a minimum number of degrees such that portions of support panel 32 extending from one side of guide 34 overlap portions of support panel 32 extending from the other side of guide 34. In the example illustrated, guide 34 directs support panel 32 through a turn of 180 degrees such that those portions of support panel 32 extending from one side of guide 34 overlap and extends parallel to portions of support panel 32 extending from the other side of guide 34. In implementations where such portions of support panel 32 extending from opposite sides are ends of guide 34 are parallel to one another, the spacing between such portions is smaller as compared to when such portions are obtuse, reducing a thickness of electronic display device 20. In yet another implementation, guide 34 directs support panel 32 through a turn of greater than 180 degrees such that those portions of support panel 32 extending from one side of guide 34 overlap and converge towards portions of support panel 32 extending from the other side of guide 34. In such an implementation, a thickness of the electronic device distant guide 34 is even further reduced.

Actuator 36 comprises a device to locally apply a stimulus to those portions of support panel 32 that are in close proximity to guide 34 such that such portions are in a flexible state or are automatically in a bent shape conforming to guide 34 and such that remaining portions of support panel 32, not in sufficient proximity to guide 34 are in a rigid planar state. In one implementation, actuator 36 applies a local stimulus to just those portions of support panel 32 in actual contact with guide 34. In another implementation, actuator 36 applies a local stimulus to portions of support panel 32 immediately approaching guide 34, from one or both ends of guide 34, preparing such immediate approaching portions of support panel 32 for bending about guide 34. In some implementations where electronic display device 20 comprises additional supporting structures for supporting portions of support panel 32 extending from guide 34, actuator 36 may apply stimulus to such portions of support panel 32 extending from guide 34, wherein those portions of support panel 32 which have no additional support or which cantilever from electronic device 20 do not receive stimulus or do not receive a sufficient amount of stimulus from actuator 36 so as to actuate to a flexible state.

In the example illustrated, actuator 36 is located below the guiding surfaces 38 of guide 34 with the guiding surfaces 38 being sandwiched between actuator 36 and support panel 32. In other implementations, actuator 36 may be provided at other locations. In one implementation, actuator 36 is incorporated as part of guide 34. In yet another implementation, as indicated by broken lines, an actuator 36' is located in or supported opposite to guide 34 with support panel 32 passing between guide surfaces 38 and actuator 36'. In one implementation, electronic display device 20 may comprise both actuator 36 and 36', wherein actuator 36 and 36' direct stimulus towards both sides or faces of support panel 32.

FIGS. 1 and 2 illustrate operation of electronic display device 20. FIG. 1 illustrates electronic display device 20 with flexible display panel 30, as supported by support panel 32, in an example compact state in which the portion of flexible display panel 30 being used (being viewed from the bottom as seen in FIG. 1) has a compact length Lc. In one implementation, the compact length Lc is less than or equal to a width of the housing or remaining body electronic display device 20. As a result, the width of electronic display device 20 is defined by the width of its housing, facilitating more manageable carrying and transport of electronic display device 20. For example, in one implementation, the width of electric display device 20 may be similar to a smart phone, allowing electric display device 22 be easily carried within one's pocket or to be more easily handheld of viewing flexible display panel 30 with the compact length Lc.

In the example illustrated, support panel 32, 132 has an overall length between ends 60, 62 such that the compact length Lc extending from one end of guide 34 and being viewed is substantially equal to the unused length Lu extending from an opposite side of guide 34. Because the unused length Lu of support panel 32, 132, is sufficiently distant actuator 36, 36', the unused length Lu of support panel 32, 132 returns to a rigid state, resulting in unused length Lu of support panel 32, 132 being parallel to the compact length Lc being utilized. Because the unused length Lu substantially equals the used compact length Lc, the usable length of flexible display 30 may be increased by 90 to 100%, almost doubling the amount of viewable area without increasing the width of the electronic storage device 20 to contain or house the unused length Lu.

FIG. 2 illustrates electronic display device 20 in a partially extended state in which flexible display panel 30 and support panel 32, 132 provide a user with a display area having an extended length Le. In the partially extended state, one portion of flexible display panel 30 and support panel 32, 132 extending from one side of guide 34 is longer than any remaining portion of flexible display panel 30 and support panel 32, 132 extending from the other side of guide 34. In one implementation, when extended, support panel 32, 132 and flexible display panel 30 project or extend beyond a perimeter of the remainder of the electronic display device 20 such that flexible display panel 30 and support panel 32 are cantilevered from an edge of the housing of electronic display device 20. When extended and when cantilevered from the edge of electronic display device 20, support panel 32, 132 is no longer receiving stimulus from actuator 36, 36' such that those cantilevered portions of support panel 32, 132 are in a rigid state and are planar to support the cantilevered portion of flexible display panel 30. In the extended position, flexible display panel 30 and support panel 32 provide a user with a much greater area for viewing images, data, text and the like, allowing electronic display device 20 present images in a fashion similar to that of a tablet computer as compared to a smart phone.

During extension of flexible display panel 30 and the underlying support panel 32, 132 (in the direction of arrow 66 in FIG. 1) from the viewed compact length Lc to the extended length Le, actuator 36, 36' applies stimulus to those portions of support panel 32, 132 that are in proximity to guide 34. As a result, those portions of support panel 32, 132 guided by and turned about guide 34, temporarily change state from a normally rigid planar state to a flexible state or a predefined bent shape, facilitating bending or turning of support panel 32, 132 about guide 34. Once moved sufficiently away from guide 34 and away from actuator 36, 36', portions of support panel 32 no longer receive stimulus from actuator 36, 36' and return to a rigid planar state. By returning to a rigid planar state, support panel 32, 132 is able to cantilever itself and flexible display panel 30 beyond the perimeter edge of a housing of the electronic display device for enhanced viewing area.

Likewise, when support panel 32 and the corresponding flexible display panel 30 are being retracted by moving moved in the direction indicated by arrow 68 in FIG. 2, actuator 36, 36' also applies stimulus to those portions of support panel 32, 132 that are in proximity to guide 34. As a result, those portions of support panel 32, 132 guided by and turned about guide 34, temporarily change state from a naturally rigid planar state to a flexible state or a bent shape, facilitating bending or turning of support panel 32, 132 about guide 34. Once moved sufficiently away from guide 34 and away from actuator 36, 36', portions of support panel 32 no longer receive stimulus from actuator 36, 36' and return to a rigid state.

In one implementation, once support panel 32, 132 has been moved about guide 34 to a desired usable length, Lc, Le or another length, actuator 36 ceases applying the stimulus to support panel 32, 132 such that those portions of support panel 32, 132 that turn or wrap about guide 34 return to a rigid curved state, securing or locking support panel 32, 132, and flexible display panel 30, in place. In yet another implementation, actuator 36, 36' continues to apply stimulus and continues to maintain those portions of support panel 32, 132 that are in proximity to guide 34 in a flexible state, wherein a catch, gripping mechanism, clamp or other retainer engages support panel 32 to secure support panel 32 and flexible display panel 30 at the user selected viewed length.

Figure 4:
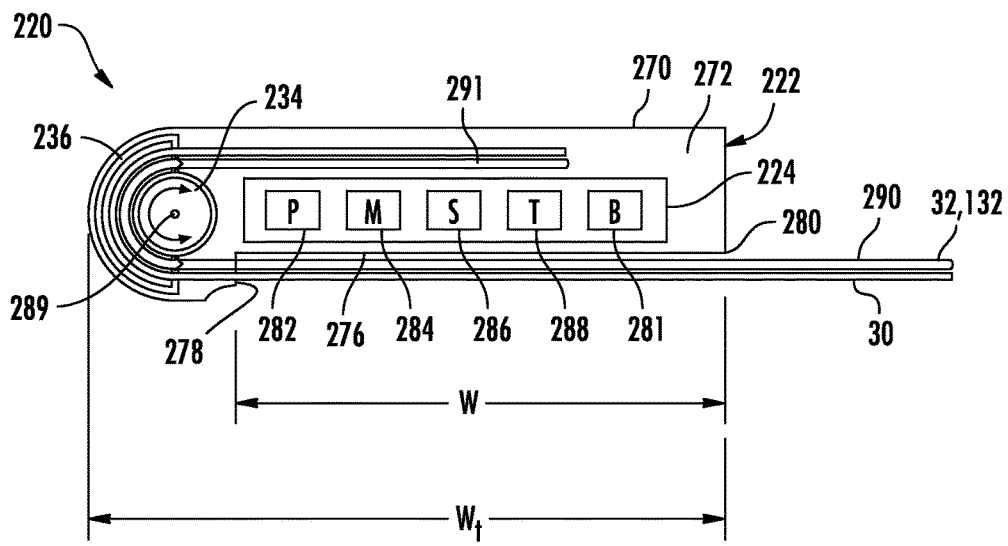
FIG. 4 is a sectional view of another example electronic display device in an extended state.
Figure 5:
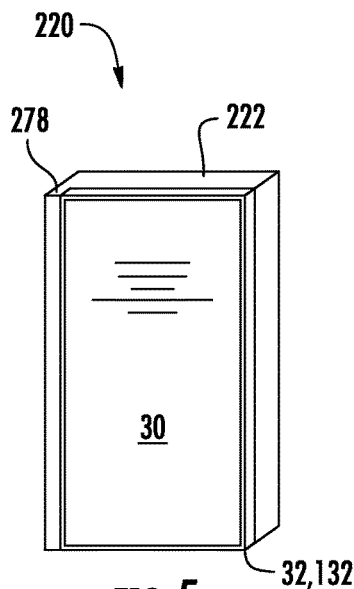
FIG. 5 is a front perspective view of the electronic display device of FIG. 4 in a compact state.
Figure 6:
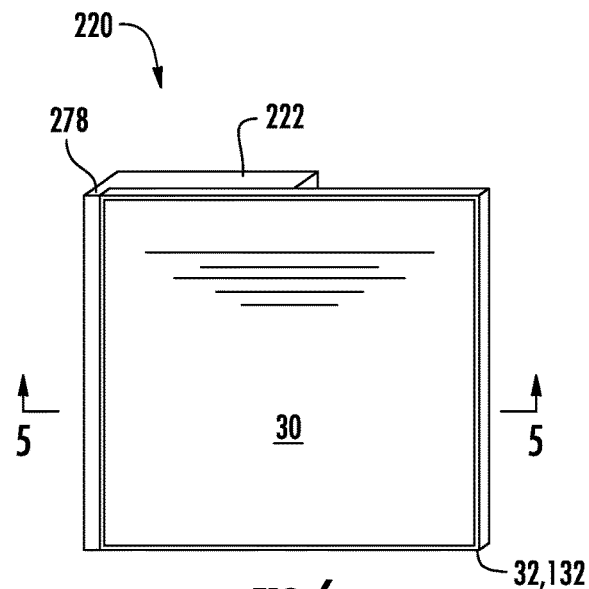
FIG. 6 is a front perspective view of the electronic display device of FIG. 4 in another extended state.

FIGS. 4-6 illustrate electronic display device 220, an example implementation of electronic display device 20. Electronic display device 220 comprises housing 222, electronics 224, flexible display panel 30, support panel 32, guide 234 and actuator 236. Housing 222 comprises a body enclosing and supporting the remaining components of electronic display device 220. Housing 222 comprises a series of outer walls or a shell 270 having an interior 272 and providing a display support platen 276.

Interior 272 contains electronics 224, guide 234 and actuator 236. Interior 272 further contains those portions of support panel 32 and flexible display panel 30 which are wrapping about guide 234 or which are not being used, those portions that are not extended across support platen 276. In the example illustrated, shell 270 defines an opening 278 facing in a direction across the platen 276. Support panel 32 and flexible display panel 30 pass through opening 278 into interior 272, about guide 234 and further into interior 272. In the example illustrated, those portions of support panel 32, 132 and flexible display panel 30 that are stored within interior 272 and are not being used extend from guide 234 on an opposite side of electronics 224 such that electronics 224 are sandwiched between the used portion of support panel 32, 132 and the unused portion of support panel 32. In other implementations, both the used and unused portions of flexible display panel 30 and support panel 32 extend on one side of electronics 224.

Display support platen 276 comprises a face of housing 222 providing a platform for underlying at least a portion of support panel 32 and flexible display panel 30. Platen 276 provides additional support to those used portions of the display panel 30 and support panel 32 which overlie platen 276. As discussed above with respect to electronic display device 20, those portions of flexible display panel 30 cantilevered beyond the end 280 of platen 276 are supported by corresponding underlying portions of support panel 32 which are in a rigid planar state. In one implementation, display support platen 276 has a width W of at least 2 inches and less than or equal to 4 inches, such that electronic display device 220 has a total width Wt of less than or equal to 4 inches, facilitating transport of electronic display device 220 in a pocket of an article of clothing when support panel 32 and flexible display panel 30 are moved to a compact state in which support panel 32 and flexible display panel 30 do not extend beyond and 280 of platen 276 or beyond an outer perimeter of housing 222. In other implementations, platen 276 and electronic display device 220 may have other widths or dimensions.

Electronics 224 comprise electronic components of electronic display device 220. In the example illustrated, electronics 224 comprises one or more circuit boards or other supporting structures supporting a bus and electronic components such as battery 281, processor 282, memory 284, sensors 286 and transceiver 288, each of which is schematically shown. Battery 281 stores and supplies electrical power for use by electronic display device 220.

Processor 282 comprises one or more processing units to carry out instructions provided by memory 284. For purposes of this application, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, processor 282 and memory 284 may be embodied as part of one or more application-specific integrated circuits (ASICs). Unless otherwise specifically noted, the controller is not limited to any specific combination of hardware circuitry and software, nor to any particular source for the instructions executed by the processing unit.

In the example illustrated, processor 282, following instructions contained in memory 284 outputs control signals directing and controlling the depiction of images on flexible display panel 30 based upon applications being carried out, based upon input received through transceiver 288 or based upon input to device 220 from a touch screen provided by flexible display panel 30 or other input components of electronic display device 220. Processor 282, following instructions contained in memory 284, further outputs control signals controlling the operation of actuator 236. In some implementations, processor 282 may perform additional functions as well such as carrying out one or more programs or applications provided by electronic display device 220.

Memory 284 comprises a non-transitory computer-readable medium containing code, program logic or other computer-readable instructions for directing the operation of processor 282. Memory 284 further facilitates the storage of settings, application programs and data.

Sensor 286 comprises sensing devices that sensor detect various characteristics with respect to electronic display device 220. For example, in one implementation, sensor 26 may comprise accelerometers or gyrometers which detect the orientation or movement of electronic display device 220.

Transceiver 288 comprises one or more devices that communicate with external nodes. In one implementation, transceiver 288 comprise an antenna facilitating communication with a global positioning system (GPS) or global navigation satellite system (GNSS). In one implementation, transceiver 288 additionally or alternatively comprises an antenna facilitating communication across a mobile telephone network. In one implementation, transceiver 288 additionally or alternatively comprise an antenna or device to facilitate communication across a local area network or a wide area network (such as the Internet). In some implementations, sensor 26 and/or transceiver 288 may be omitted.

Guide 234 is similar to guide 34 described above except that guide 234 is specifically illustrated as a roller configured to rotate in either direction about axis 289. Guide 234 facilitates easier movement of support panel 32 and flexible display panel 30 between extended and retracted positions. In other implementations, guide 234 may have other configurations.

Actuator 236 is similar to actuator 36, 36' described above except that actuator 236 is specifically illustrated as extending on both sides of support panel 32, 132 and flexible display panel 30. Actuator 236 sandwiches support panel 32, 132 therebetween. Actuator 236 applies stimulus to both sides of support panel 32, 132 so as to change support panel 32, 132 from a rigid planar state to a flexible state or a bent shape.

As shown by FIG. 4, in the example illustrated, electronics 224 has a thickness less than or equal to the height of the arc or turn provided by guide 234 such that electronics 224 contained between the use in unused portions of flexible display panel 30 and the supporting support panel 32, 132. Through such efficient utilization of space within interior 272, the compactness and thinness of electronic device 220 is preserved.

FIGS. 5 and 6 illustrate support panel 32 and the associated portions of flexible display panel 30 in a compact state and an extended state, respectively. As shown by FIG. 5, in the compact state, support panel 32 and flexible display panel 30 are contained within interior 272 to an extent such that the viewed or used portion of support panel 32 and flexible display panel 30 are coextensive with platen 276 (shown in FIG. 5) or minimally extend beyond end 280 of platen 276. In such a compact state, electric display device 220 has a width equal to the total width Wt of shell 270.

As shown by FIG. 6, in the extended state, support panel 32, 132 and flexible display panel 30 are withdrawn from interior 272 such that support panel 32, 132 and flexible display panel 30 extend from guide 234, across the platen 276 and beyond and 280 of platen 276. As a result, portions of support panel 32, 132 and flexible display panel 30 are cantilevered beyond the edge of electronic display device 20 to provide additional usable viewing area for the display of electronic display device 220. In the extended state, support panel 32, 132 provides sufficient rigidity to flexible display panel 30 such that the cantilevered portion 290 remains coplanar with those portions of support panel 32 extending over platen 276. In one implementation, support panel 32, 132 provides sufficient rigidity so as to maintain the planar shape of flexible display panel 30 when receiving forces from tactile or stylus input to the touch screen elements of flexible display panel 30.

Although support panel 32, 132 is illustrated as being coextensive with flexible display panel 30, in other implementations, a tail portion 291 of support panel 32, 132 may project beyond an end of flexible display panel 30. In one implementation, the tail portion 291 of support panel 32, 132 is not withdrawn from housing 222. Despite full extension of flexible display panel 30, the tail portion 291 remains within interior 272, either parallel to platen 276 or wrapped about guide 234. In recognition that any flexible display panel 30 overlying tail portion 291 cannot be utilized or viewed, in one implementation, flexible display panel 30 does not extend over tail portion 291

In one implementation, instructions contained in memory 284 direct processor 282 to output control signals controlling the presentation and formatting of images on flexible display panel 30 based upon an extent to which flexible display panel 30 is being presently being viewed or is external to device 220. In one implementation, device 220 includes one or more sensors, such as sensor 286, which detect how far flexible display panel 30 and support panel 32, 132 have been withdrawn from interior 272. Based upon this determination, processor 282 scales, crops or formats the images/text being presented to most efficiently utilize available space of flexible display panel 30. In one implementation, processor 282 deactivates those portions of flexible display panel 32 which are not viewable, such as those portions that are wrapped about guide 234 or which extend from guide 234 into interior 272 to preserve battery power.

Figure 7:
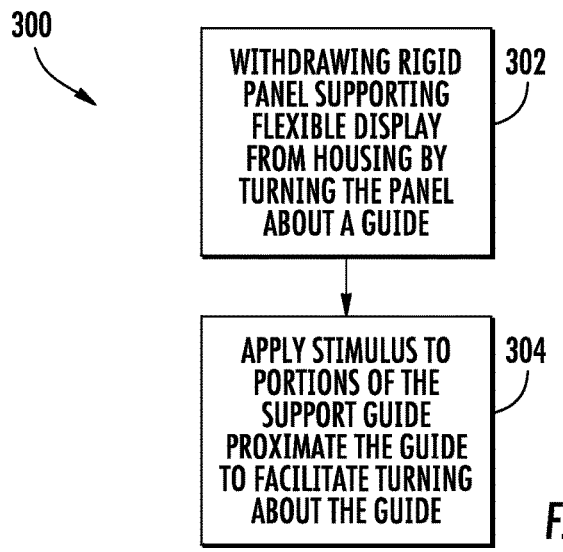
FIG. 7 is a flow diagram of an example method for actuating an electronic display device between a compact state and an extended state.

FIG. 7 is a flow diagram of an example method 300 that may be carried out by electronic display device 220. As indicated by block 302, a support panel 32, 132 supporting the flexible display panel 30 is withdrawn from a housing 222 by turning the panel 32, 132 about a guide 34, 234. As indicated by block 304, a local stimulus is applied to those portions of panel 32, 132 that are proximate to the guide 34, 234 to facilitate bending or turning of support panel 32, 132 and the supported display panel about the guide.

Figure 8:
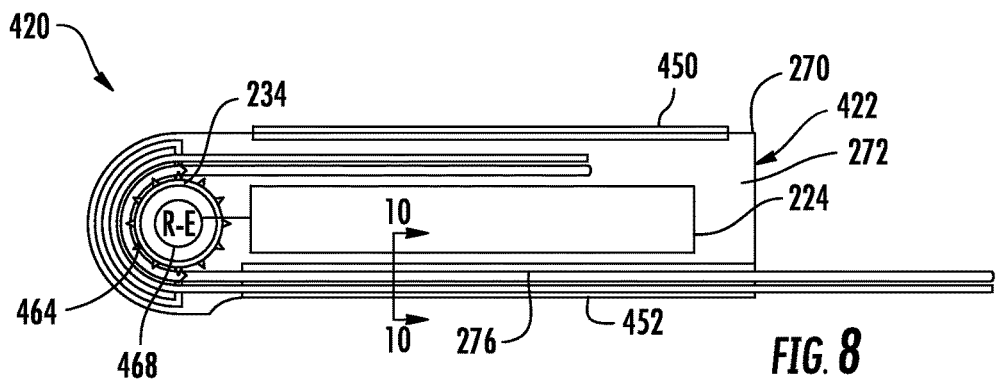
FIG. 8 is a sectional view of another example electronic display device in an extended state.
Figure 9:
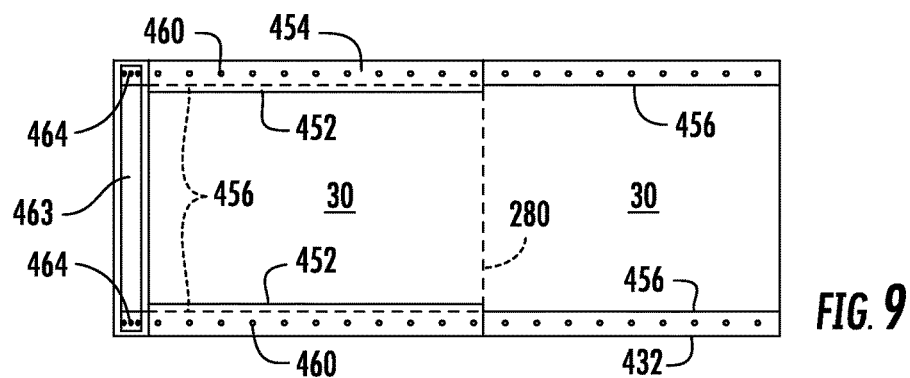
FIG. 9 is a top plan view of the electronic display device of FIG. 8 in another extended state.
Figure 10:
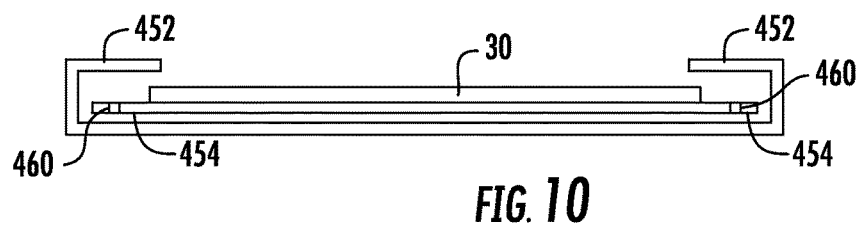
FIG. 10 is a sectional view of the electronic display device of FIG. 8 taken along lines 10-10.

FIGS. 8-10 illustrate electronic display device 420, another example implementation of electronic display device 20. Electronic display device 420 is similar to electronic display device 220 except that electronic display device 420 comprises housing 422, support panel 432 and guide 434 in lieu of housing 222, support panel 32, 132 and guide 234, respectively. Those remaining components or elements of device 420 which correspond to components of device 220 are numbered similarly or are shown in FIG. 4.

Housing 422 is similar to housing 222 except that housing 422 additionally comprises window 450 and perimeter shields 452. Window 450 comprises a transparent pane along an exterior of shell 270 generally opposite to platen 276. Window 450 facilitates viewing of those portions of flexible display panel 30 which are within interior 272 in which extend parallel to those portions of flexible display panel 30 that overlie platen 276. As a result, window 450 allows images or information to be presented on both sides of electronic display device 420. In one implementation, electronics 224 provides a user with an option of selecting a first mode of operation in which images are presented on those portions of flexible display panel 30 overlying platen 276, but not on those portions within interior 272, a second mode of operation which images are presented on those portions of flexible display panel 30 within interior 272, but not on those portions overlying platen 276 and a third mode of operation which images are presented on those portions of flexible display panel 30 overlying platen 276 as well as those portions within interior 272 and viewed through window 450. In other implementations, window 450 is omitted.

Perimeter shields 452 comprise overhangs or tabs that are cantilevered over and above edge portions of platen 276. As shown by FIGS. 8 and 9, perimeter shields 452 project over and conceal those portions of support panel 432 which project beyond flexible display panel 30. In the example illustrated, shields 452 additionally extend over edge portions of flexible display panel 30. In other implementations, perimeter shields 452 do not extend over and above flexible display panel 30, but are flush are recessed relative to the upper surface of flexible display panel 30. In still other implementations, perimeter shields 452 are omitted.

Support panel 432 is similar to support panel 32 or support panel 132 except that support panel 432 comprises extensions 454 that project beyond edges 456, of flexible display panel 30. Extensions 454 provide services by which support panel 432 is gripped by guide 434. In the example illustrated in which guide 434 comprises sprocket teeth, extensions 454 comprise corresponding sprocket openings 460. In other implementations, extensions or 460 may omit openings 460, wherein extensions 454 are frictionally engaged by rubber or other traction surfaces of actuator 434.

Guide 434 is similar to guide 234 except that in addition to guiding and directing turning of support panel 432 during turning of support panel 432, guide 434 moves or drives support panel 432 and flexible display panel 30 in at least one direction between at least one compact state and at least one extended state. In the example illustrated, guide 434 comprises a rotatable roller 463 having sprocket teeth 464 and a retractor extender 468. Sprocket teeth 464 interact with and are received within sprocket openings 460 in extension 454 of support panel 434. Sprocket teeth 464 interact with openings for 460 to precisely control positioning of support panel 432 and flexible display panel 30. In other implementations, sprocket teeth 464 are omitted, wherein other structures for gripping extensions 454 are provided on the roller of guide 434.

Retractor extender 468 comprises a mechanism to rotationally drive the roller of guide 434. In one implementation, retractor extender 468 comprises a torsion spring having one portion coupled to housing 422 and a second portion coupled to the roller of guide 434. In such an implementation, the torsion spring resiliently biases support panel 432 towards an extended position in which support panel 432 extends beyond and 280 of platen 276, wherein a user may manually move support panel 432 against such a bias into interior 432. In another implementation, the torsion spring resiliently biases support panel 432 towards a retracted or withdrawn position in which support panel 432 extends into interior 270, wherein a user may manually move support panel 432 against such a bias to pull support panel 432 and flexible display panel 30 from the interior 270. In such implementations, electronic display device 420 additionally includes a catch, hook, clamp or other mechanism for releasably securing support panel 432 at a desired length or actuator 236 ceases the application a stimulus to support panel 432 such of those portions of support panel 432 about guide 434 become rigid, locking support panel 432 in the user established length.

In yet another implementation, retractor extender comprises a source of torque operably coupled to the roller of guide 434. For example, in one implementation, retractor extender 468 comprises a servo motor or a stepper motor operably coupled to shaft 463 us to selectively drive shaft 463 and support panel 432 in either direction to extend or retract support panel 432 and display panel 30. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The term "operably coupled" shall mean that two members are directly or indirectly joined such that motion may be transmitted from one member to the other member directly or via intermediate members. For purposes of this disclosure, the phrase "configured to" denotes an actual state of configuration that fundamentally ties the stated function/use to the physical characteristics of the feature proceeding the phrase "configured to".

In one implementation, processor 282, following instructions contained in memory 284, outputs control signals in response to inputs received through touch screen elements of display panel 30 or via input buttons, switches and the like located on the external surface of housing 222, wherein the control signals rotate shaft 463 to drive shaft 463 and support panel 432 to a desired compact length Lc or extended length Le. In yet another implementation, processor 282 automatically outputs control signals in response to signals received from sensor 286 indicating an orientation or positioning of electronic display device 220, wherein the control signals automatically move support panel 432 to a predefined compact length Lc (described above) or a predefined extended length Le based upon the orientation of device 220. In yet another implementation, instructions contained in memory 284 cause processor 282 to output control signals in response to manual taps on display panel 30, a touchscreen, wherein each individual tap results in processor 282 incrementally driving support panel 432 a predefined distance out of housing 422 or into housing 422. In yet another implementation, instructions contained in memory 284 cause processor 282 to output control signals driving shaft 433 based upon a sliding gesture of one or more fingers across display panel 30 overlying platen 276. For example, a sliding gesture across and in contact with display panel 30 to the right, as seen in 8, causes further extension of support panel 432. A sliding gesture across any contact with display panel 30 to the left, as seen in FIG. 8, causes further retraction of support panel 432. The distance of the sliding gesture across display panel 30 (when a touch screen) controls the distance of extension or retraction.

Figure 11:
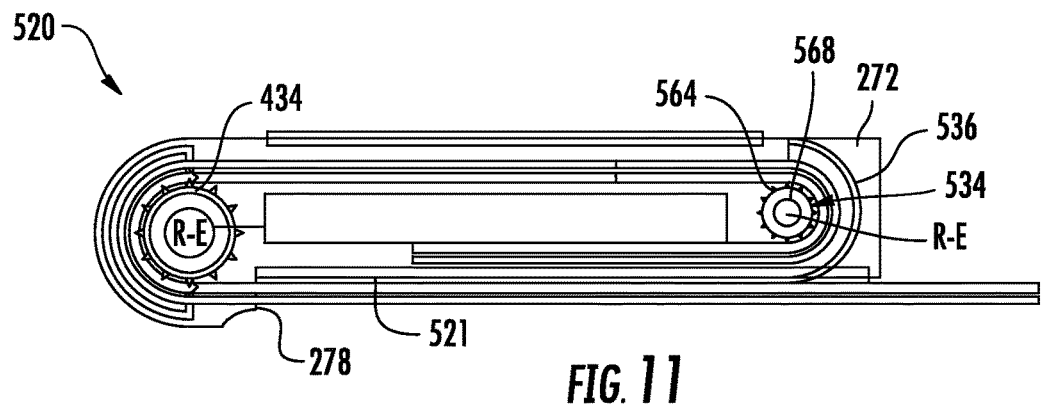
FIG. 11 is a sectional view of another example electronic display device in an extended state.

FIG. 11 is a sectional view illustrating electronic display device 520, another example implementation of electronic display device 20. Electronic display device 520 is similar to electronic display device 420 except that electronic display device 520 additionally comprises tactile input region 521, guide 534 and actuator 536. Those remaining components are elements of device 520 which correspond to elements of components of device 420 are numbered similarly in FIG. 11 or are shown in FIGS. 8-10.

Figure 12:
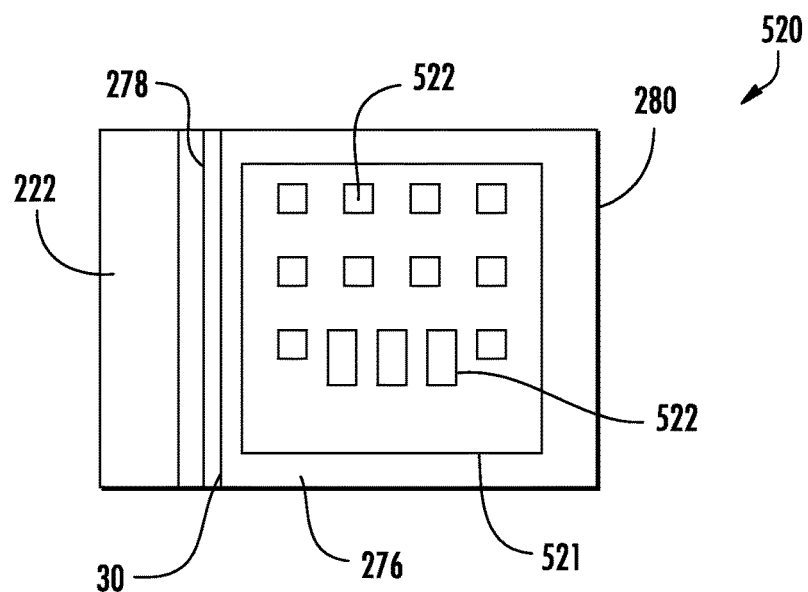
FIG. 12 is a top plan view of the electronic display device of FIG. 11 in a fully retracted state.

Tactile input region 521 comprises a panel of keys or an array of keys extending across the platen 276. In one implementation, tactile input region 521 comprises an array of alphanumeric or numerical keys 522. In one implementation, tactile input region 521 comprises the keys of a mobile phone. Such keys of tactile input region 520 become accessible and viewable with the retraction of support panel 432 and display panel 30. FIG. 12 is a top view of device 520 with support panel 432 and display panel 30 in a fully retracted or compact state in which support panel 432 and display panel 30 are essentially withdrawn from platen 276. In such a state, various depressable or tactile sensing physical keys along platen 276 become accessible for manual input. In one implementation, processor 282, following instructions contained memory 284, automatically activates and deactivates tactile input region 520 based upon a sensed extent to which support panel 432 and display panel 30 are extended or retracted. In yet other implementations, tactile input region 520 is omitted.

Guide 534 and actuator 536 or similar to guide 434 and actuator 236 except that guide 534 and actuator 536 are spaced from guide 434. In the example illustrated, guide 534 and actuator 536 are located within interior 272 at an opposite end of housing 222 as compared to guide 434. Like actuator 436, actuator 536 selectively applies a local stimulus to portions of support panel 432 in proximity with guide 534 which causes such portions in proximity with guide 534 to change from a rigid planar state to a flexible state or a bent shape, depending upon the composition of support panel 432 and the applied stimulus. Like guide 434, guide 534 guides and directs those portions of support panel 432 that have been changed to a flexible state or a bent shape about a curve or turn. In the example illustrated, guide 534 turns support panel 432 and the carried display panel 30 at least 180 degrees such that support panel 432 and display 30 extend back towards guide 434. As a result, support panel 432 and display panel 30 extend on both sides of electronics 224 while extending within interior 272. Because guide 534 turns support panel 432 back towards guide 434, guide 434 and 534 cooperate to increase the length of support panel 432 and display panel 30 that are receivable within interior 272. As a result, the reduced with of housing 222 is maintained while the longest extendable length of support panel 432 and display panel 30 is increased.

In the example illustrated, guide 534 is similar to guide 434 in that guide 534 also comprises sprocket teeth 564 for interacting with openings for 60 in extensions 454 of support panel 432. Like a guide 434, guide 534 further comprises a retractor extender 568 similar to retractor extender 468 described above. In other implementations, guide 534 may omit sprocket teeth 464 utilize other traction mechanisms for gripping support panel 432. In still other implementations, guide 534 is replaced with guide 234 or guide 34 described above. In yet other implementations, guide 534 and actuator 536 are omitted.

Figure 13:
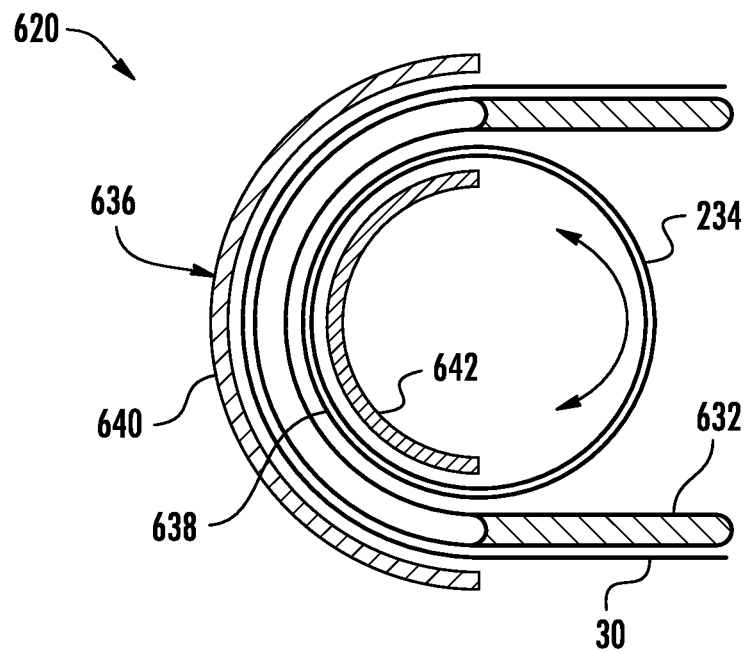
FIG. 13 is a sectional view of a portion of another example electronic display device.

FIGS. 13-16 illustrate various combinations of support panels and actuators for use in any of electronic display devices 20, 220, 420 or 520. Although FIG. 13-16 illustrate the use of guide 234, in other implementations, the illustrated support panel additionally comprises extensions 454 with sprocket openings 460 which are engaged by sprocket teeth provided by guides 434 or 534 which are utilized in place of guide 234. FIG. 13 illustrates a portion of electronic display device 620, an implementation of electronic display device 20. Electronic display device 620 is similar to electronic display device 520 except that electronic display device 620 is specifically illustrated as comprising support panel 632, guide 234 (described above) and actuator 636.

Support panel 632 is similar to support panel 32 or 132 described above except that support panel 632 specifically comprises a thermo-softening plastic, a polymer that becomes pliable, multiple or flexible above a specific, but not dramatically different, temperature and returns a solid-state upon cooling. When the material of support panel 632 is heated to a temperature above the glass transition temperature, but the lowest melting point, the material support panel 632 becomes flexible without a phase change. Once the temperature of the material of support panel 632 drops to below its glass transition temperature, support panel 632 returns to a rigid state. In implementation, support panel 632 is composed of one or more materials having a glass transition temperature between 140 and 390. In other implementations, other materials may be chosen. Examples of thermo-softening plastics include, but are not limited to, acrylic, Acrylonitrile butadiene styrene, Perspex, and Polystyrene.

Actuator 636 applies the stimulus to support panel 632 to change portions of support panel 632 in proximity with guide 634 to a flexible state. In the example illustrated, actuator 636 comprises a pair of heaters, a first heater 640 outside of support panel 632 and display panel 30 and a second heater 642 inside of support panel 62 of display panel 30. In the example illustrated, heater 642 is within or near guiding surfaces 638 of guide 234. In response to control signals from processor 282 (shown in FIG. 11), heaters 640, 642 heat those portions of support panel 632 in proximity with guide 234 to a temperature above the glass transition temperature of the material forming support panel 632, yet below the melting temperature of such material(s), so as to actuate support panel 632 to a flexible state allowing panel 632 to bend about the turn of guide 234. After being moved away from guide 234 and actuator 636, the material of support panel 632 cool to a temperature below the glass transition temperature of the material such that support panel 632 returns to a rigid state.

Figure 14:
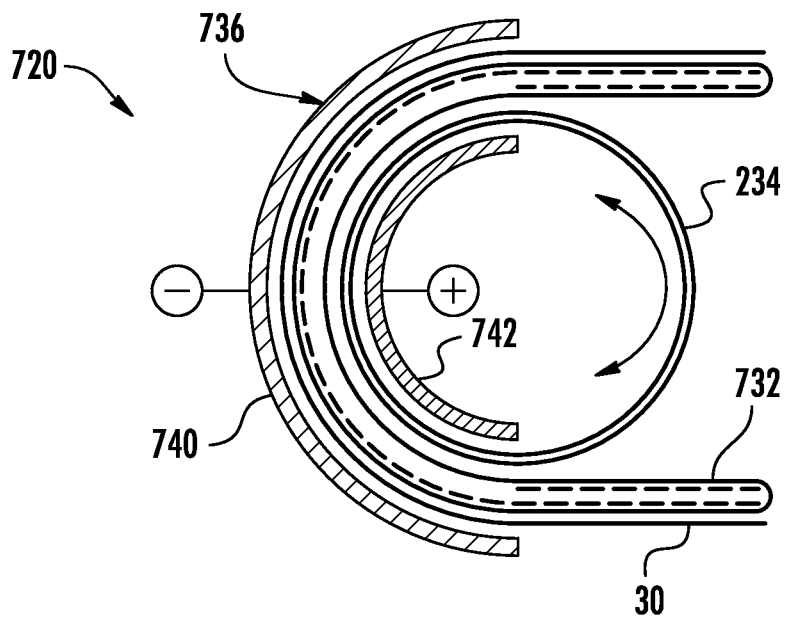
FIG. 14 is a sectional view of a portion of another example electronic display device.

FIG. 14 illustrates a portion of electronic display device 720, an implementation of electronic display device 20. Electronic display device 720 is similar to electronic display device 520 except that electronic display device 720 is specifically illustrated as comprising support panel 732, guide 234 (described above) and actuator 736.

Support panel 732 is similar to support panel 32 or 132 described above except that support panel 732 specifically comprises an electro-active polymer, a polymer that exhibits a change in shape when stimulated by an electric field. Examples of electro-active polymers include, but are not limited to, Ionic polymer-metal composites (IPMCs) (Nafion, Flemion), Ferroelectric polymers (polyvinylidene fluoride (PVDF).

Actuator 736 applies the local stimulus to support panel 732 to change portions of support panel 732 in proximity with guide 734 to a predefined bent shape. In the example illustrated, actuator 736 comprises a pair of electrodes, a first electrode 740 on a first side of support panel 732 and display panel 30 and a second electrode 742 on a second opposite side of support panel 732 and display panel 30. In the example illustrated, electrode 742 is within or near guiding surfaces 638 of guide 234. In response to control signals from processor 282 (shown in FIG. 11), electrodes 740, 742 stimulate those portions of support panel 732 in proximity with guide 234 with an electric field so as to actuate support panel 732 to a memorized bent shape corresponding to the bent shape of guide 234, allowing panel 732 to bend about the turn of guide 234. After being moved away from guide 234 and actuator 736, the material or materials of support panel 732 become withdrawn from the electric field such that support panel 732 returns to a rigid planar shape.

Figure 15:
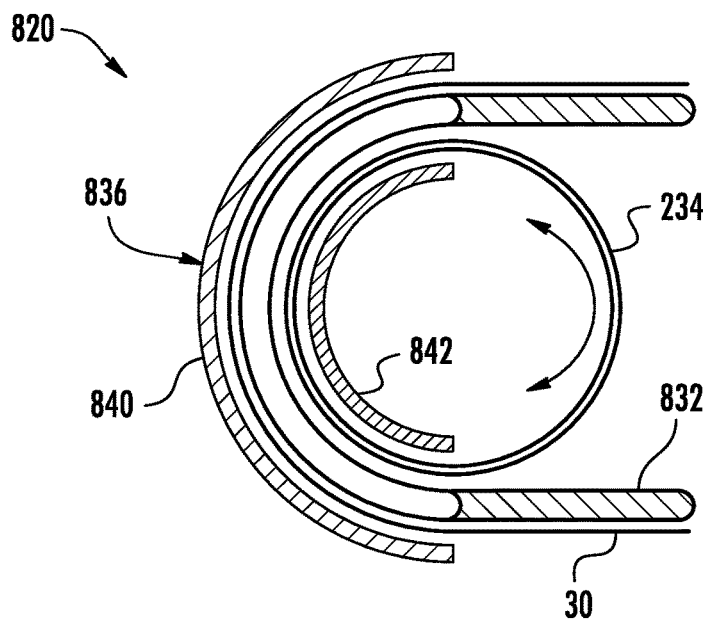
FIG. 15 is a sectional view of a portion of another example electronic display device.

FIG. 15 illustrates a portion of electronic display device 820, an implementation of electronic display device 20. Electronic display device 820 is similar to electronic display device 520 except that electronic display device 820 is specifically illustrated as comprising support panel 832, guide 234 (described above) and actuator 836.

Support panel 832 is similar to support panel 32 or 132 described above except that support panel 832 specifically comprises a two-way shape memory alloy or shape memory polymer, an alloy or polymer that remembers its original shape and once deformed returns to its pre-deformed shape when heated. Examples of shape memory alloys include, but are not limited to, copper-aluminum-nickel alloys, nickel-titanium alloys, and iron-manganese-silicon alloys.

Actuator 836 applies the local stimulus to support panel 832 to change portions of support panel 832 in proximity with guide 834 to a predefined bent shape. In the example illustrated, actuator 836 comprises a pair of heaters or heating devices, a first heater 840 on a first side of support panel 832 and display panel 30 and a second heater 842 on a second opposite side of support panel 832 and display panel 30. In the example illustrated, heater 842 is within or near guiding surfaces 638 of guide 234. In response to control signals from processor 282 (shown in FIG. 11), heaters 840, 842 heat those portions of support panel 832 in proximity with guide 234 to a temperature above a predefined threshold temperature so as to actuate support panel 832 to a memorized bent shape corresponding to the bent shape of guide 234, allowing panel 832 to bend about the turn of guide 234. After being moved away from guide 234 and actuator 836, the material or materials of support panel 832 become withdrawn from the heat so as to cool below the triggering temperature such that support panel 832 returns to a rigid planar shape.

In yet other implementations, support panel 832 comprises a light-induced shape memory polymer which, in response to receiving and while receiving an applied stimulus in the form of light of a certain range of frequencies, automatically changes from a planar shape to a remembered bent, curved or rounded shape that corresponds to the bent, curved or round shape of guide 34. In such an implementation, actuator 836 applies a local stimulus in the form of light within the certain range of frequencies to actuate support panel 832 to a memorized bent shape corresponding to the bent shape of guide 234, allowing panel 832 to bend about the turn of guide 234. After being moved away from guide 234, the changed material or materials of support panel 832 become withdrawn from the light so as to return to a rigid planar shape.

In yet other implementations, support panel 832 comprises an electric field responsive shape memory polymer which, in response to receiving and while receiving an applied stimulus in the form of a predefined electric field, automatically changes from a planar shape to a remembered bent, curved or rounded shape that corresponds to the bent, curved or round shape of guide 34. In such an implementation, actuator 836 applies a local stimulus in the form of an electric field to actuate support panel 832 to a memorized bent shape corresponding to the bent shape of guide 234, allowing panel 832 to bend about the turn of guide 234. After being moved away from guide 234, the changed material or materials of support panel 832 become withdrawn from the electric field so as to return to a rigid planar shape.

Figure 16:
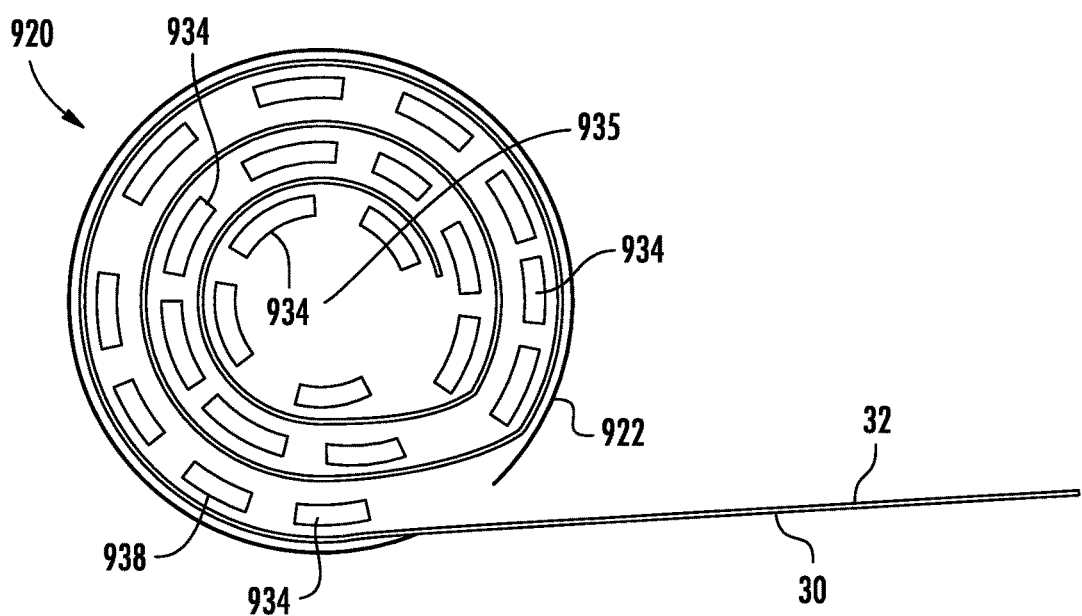
FIG. 16 is a sectional view of an example electronic display device in an example extended state.

FIG. 16 is a sectional view illustrating electronic display device 920, another example implementation of electronic display device 20. Electronic display device 920 comprises housing 922, flexible display panel 30, support panel 32 and guides-actuators 934. Housing 922 comprises a body facilitating the coiling of flexible to play panel 30 and support panel 32 (described above) about a central axis 935. Housing 922 supports guide-actuators 934.

Guides-actuators 934 comprise a spiral arrangement of structures that serve as guides by providing arcuate, bent or curved surfaces 938 which guide and direct support panel 32 in a spiral or helical path about axis 935. Guides-actuators 934 comprise a spiral arrangement structures that serve as actuators by emitting or otherwise directing stimulus at adjacent portions of support panel 32 so as to actuate such adjacent portions of support panel 32 or so as to maintain adjacent portions of support panel 32 in a flexible state and/or a bent or curved shape corresponding to the arcuate or curved shape of surfaces 938.

In one implementation, support panel 32 comprises a thermal softening plastic, wherein guides-actuators 934 comprise heaters. In another implementation, support panel 32 comprises a shape memory material, such as a shape memory alloy, a shape memory polymer or an electro-active polymer which automatically changes between two different predefined shapes in response to an applied stimulus such as heat above a predefined threshold temperature or in response to being stimulated by a predefined electric field or a light within a predefined range of frequencies.

In operation, as support panel 32 and display panel 30 are withdrawn from housing 922 and withdrawn from the stimulus being applied by guide-actuators 934, support panel 32 automatically returns to a rigid planar state, supporting flexible display panel 30 in a planar or flat layout for viewing and for receiving tactile input. As a result, support panel 32 and display panel 30 are extendable to a desired length to provide a desired viewing or interface area. To reduce a size of the kind display device 920, support panel 32 and display panel 30 are retracted into housing 922. During such retraction, rigid planar portions of support panel 32 receives stimulus from guide-actuators 934. In response to such stimulus, support panel 32 changes to a flexible state or to a remembered curved or bent shape corresponding to the curvature of surfaces 938, facilitating bending of support panel 32 and the support of display panel 30 about the helically or spirally arranged surfaces 938 to facilitate coiling of support panel 32 and display panel 30 within housing 922.

While the preferred embodiments of the disclosure have been illustrated and described, it will be appreciated that various changes can be made therein without departing from the spirit and scope of the disclosure. For example, although different example embodiments may have been described as including one or more features providing one or more benefits, it is contemplated that the described features may be interchanged with one another or alternatively be combined with one another in the described example embodiments or in other alternative embodiments. One of skill in the art will understand that the disclosure may also be practiced without many of the details described above. Accordingly, it will be intended to include all such alternatives, modifications and variations set forth within the spirit and scope of the appended claims. Further, some well-known structures or functions may not be shown or described in detail because such structures or functions would be known to one skilled in the art. Unless a term is specifically and overtly defined in this specification, the terminology used in the present specification is intended to be interpreted in its broadest reasonable manner, even though may be used conjunction with the description of certain specific embodiments of the present disclosure.

What is claimed is:

1. An electronic display device comprising:
a flexible display panel;
a support panel supporting the flexible display panel;
a guide about which the support panel turns;
an actuator to apply a local stimulus to selected portions of the support panel that are in proximity with the guide to facilitate changing the selected portions of the support panel from a rigid planar shape to a bent shape about the guide as the support panel and the display panel are moved about the guide and such that the support panel returns to the rigid planar shape once moved away from the guide; and
a processor, wherein the support panel comprises an intermediate portion turning about the guide, a first portion on a first side of the intermediate portion and a second portion on a second side of the intermediate portion, the processor being sandwiched between the first portion and the second portion.

2. The electronic display device of claim 1 further comprising a housing, wherein the support panel comprises an intermediate portion turning about the guide, a first portion on a first side of the intermediate portion within the housing and a second portion on a second side of the intermediate portion projecting from the housing on an exterior of the housing.

3. The electronic display device of claim 2, wherein a portion of the housing is transparent to facilitate viewing of the flexible display panel supported by the first portion within the housing.

4. The electronic display device of claim 2, wherein the intermediate portion comprises a shape memory polymer to change to the bent shape about the guide in response to the stimulus comprising heat, light or electrical field.

5. The electronic display device of claim 1 further comprising a drive mechanism to drive the support panel and the flexible display panel about the guide.

6. The electronic display device of claim 1, wherein the support panel comprises an open architecture, the open architecture having openings, each of the openings being individually completely surrounded by the support panel.

7. The electronic display device of claim 1, wherein the support panel comprises a thermo-softening plastic to change to the bent shape about the guide in response to the stimulus comprising heat.

8. The electronic display device of claim 1 further comprising:
a second guide about which the support panel turns; and
a second actuator to apply a second stimulus to selected portions of the support panel that are in proximity with the second guide to facilitate changing the support panel from a rigid planar shape to a bent shape about the second guide as the support panel and the display panel are moved about the second guide and such that the support panel returns to the rigid planar shape once moved away from the second guide.

9. The electronic display device of claim 1 further comprising a housing, wherein the support panel comprises an intermediate portion turning about the guide, a first portion on a first side of the intermediate portion within the housing and a second portion on a second side of the intermediate portion, the housing having a transparent panel through which the flexible display panel supported by the first portion is viewable.

10. The electronic display device of claim 1 further comprising a retractor-extender to selectively move the support panel and the flexible display panel in at least one direction about the guide.

11. The electronic display device of claim 1, wherein an entirety of those portions of the support panel moved away from the guide remain unbent.

12. The electronic display device of claim 1, wherein the support panel when extending about the guide and when moved away from the guide has a single overall thickness between an uppermost surface and a lowermost surface of the support panel that remains constant.

13. The electronic display device of claim 1, wherein the support panel comprises a light induced shape memory polymer.

14. The electronic display device of claim 1 further comprising:
at least one sensor to sense an extent at which at least one of the support panel or the display panel is moved away from the guide;
a processor to output control signals controlling presentation formatting of images on the flexible display panel based upon the sensed extent.

15. An electronic display device comprising:
a flexible display panel;
a support panel supporting the flexible display panel;
a guide about which the support panel turns;
an actuator to apply a local stimulus to selected portions of the support panel that are in proximity with the guide to facilitate changing the selected portions of the support panel from a rigid planar shape to a bent shape about the guide as the support panel and the display panel are moved about the guide and such that the support panel returns to the rigid planar shape once moved away from the guide;
a retractor extender to extend and retract the flexible display panel and the support panel; and
a processor to output control signals controlling extension and retraction of the flexible display panel by the retractor extender based upon a sensed sliding gesture across the flexible display panel.

16. An electronic display device comprising:
a flexible display panel;
a support panel supporting the flexible display panel;
a guide about which the support panel turns; and
an actuator to apply a local stimulus to selected portions of the support panel that are in proximity with the guide to facilitate changing the selected portions of the support panel from a rigid planar shape to a bent shape about the guide as the support panel and the display panel are moved about the guide and such that the support panel returns to the rigid planar shape once moved away from the guide;
a retractor extender to extend and retract the flexible display panel and the support panel;
a sensor to sense an orientation of the electronic display device; and
a processor to output control signals controlling extension and retraction of the flexible display panel by the retractor extender based upon the sensed orientation.

17. The electronic display device of claim 16 further comprising a housing, wherein the control signals that are based upon the sensed orientation move the flexible state panel between a first extended state in which the flexible display panel extends from the housing by a first usable length for viewing outside the housing and a second extended state in which the flexible display panel extends from the housing by second usable length for viewing outside the housing, the second usable length being different than the first usable length.

18. The electronic display device of claim 17, wherein the sensed orientation comprises a direction at which the flexible display panel extends from the housing.

* * * * *